(12) United States Patent
Pommerenke et al.

(10) Patent No.: US 8,143,903 B2
(45) Date of Patent: Mar. 27, 2012

(54) RESONANCE SCANNING SYSTEM AND METHOD FOR TESTING EQUIPMENT FOR ELECTROMAGNETIC RESONANCES

(75) Inventors: David J. Pommerenke, Rolla, MO (US); Wei Huang, Rolla, MO (US); Peng Shao, Rolla, MO (US); Jiang Xiao, Rolla, MO (US)

(73) Assignee: The Curators of the University of Missouri, Columbia, MO (US)

( * ) Notice: Subject to any disclaimer, the term of this patent is extended or adjusted under 35 U.S.C. 154(b) by 432 days.

(21) Appl. No.: 12/476,249

(22) Filed: Jun. 1, 2009

(65) Prior Publication Data

US 2009/0295405 A1 Dec. 3, 2009

Related U.S. Application Data

(60) Provisional application No. 61/130,464, filed on May 30, 2008.

(51) Int. Cl.
*G01R 27/04* (2006.01)
(52) U.S. Cl. .......................... 324/633; 324/642
(58) Field of Classification Search .................. 324/633, 324/642
See application file for complete search history.

(56) References Cited

U.S. PATENT DOCUMENTS 7,397,266 B2  7/2008 Pommerenke
2009/0278552 A1* 11/2009 Jakkula et al. ................. 324/633

OTHER PUBLICATIONS

Kai Wang, Dr. Pommerenke, Jian Min, Zhang, Ramachandran Chundru, "The PCB level ESD immunity study by using 3 Dimension ESD Scan System", IEEE International Symposium on EMC, Aug. 2004, pp. 343-348.
David Pommerenke, Jayong Koo, Giorgi Muchaidze, "Finding the root cause of an ESC upset event", DesignCon 2006, Santa Clara, CA, Feb. 2006.

* cited by examiner

*Primary Examiner* — Vincent Q Nguyen
(74) *Attorney, Agent, or Firm* — Thomas H. Ham; Wilson Ham & Holman

(57) ABSTRACT

A resonance scanning system and method for testing equipment for electromagnetic resonances uses a resonance detection subsystem with at least one probe to identify at least one of a resonating location, a resonating frequency and a quality factor of a resonance of the equipment and an automatic scanning subsystem to displace the probe to different testing locations of the equipment so that the resonance detection subsystem can determine if any of the different testing locations of the equipment exhibits electromagnetic resonances.

20 Claims, 11 Drawing Sheets

RESONANCE SCANNING SYSTEM AND METHOD FOR TESTING EQUIPMENT FOR ELECTROMAGNETIC RESONANCES

CROSS REFERENCE TO RELATED APPLICATION

This application is entitled to the benefit of U.S. Provisional Patent Application Ser. No. 61/130,464, filed on May 30, 2008, which is incorporated herein by reference.

BACKGROUND OF THE INVENTION

Electromagnetic compatibility (EMC) testing is widely performed on equipments, such as complete systems, integrated circuits, printed circuit boards (PCBs) and other electronic modules, to determine whether the equipments do not radiate more radio frequency (RF) energy than either allowed by regulations or acceptable to avoid interference with wireless receivers, or to determine if the equipments are susceptible to electromagnetic (EM) disturbances. An EMC test may involve a number of different EM analyses. As an example, an EMC testing may involve radiating electromagnetic waves at the equipment, measuring the emissions from the equipment or testing the immunity to electrostatic discharges (ESD).

EMI testing is usually performed according to standards, e.g., FCC normally uses a semi-anechoic chamber or an open area test site to measure the fields in the far field region. This methodology does provide little insight into the root cause of EMI problems. Further, EMI analysis can be performed by near field scanning, i.e., measuring local electric or magnetic field around equipment under test (EUT) to identify areas of strong electric or magnetic field. This near field information may then assist in identifying the cause of an EMI problem of the EUT based on an implicit assumption that an area of strong field is the cause of the EMI problem. However, this implicit assumption is often incorrect for various EUTs.

An immunity or ESD analysis can be performed by subjecting the EUT to strong electromagnetic fields (immunity) or injecting ESD currents into the EUT at different locations and determining whether an error has occurred because of the RF field or ESD current stress injected into the selected location.

The difference between the immunity analysis and the ESD analysis is the type of noise injected. Modulated RF signals are usually injected for the immunity analysis, whereas narrow pulses (having one or sub nanosecond rise time) are injected for the ESD analysis. The other relevant difference is that immunity analysis subjects the EUT to fields, most often in the far field region of the transmitting antenna, while ESD testing injects currents directly into the EUT. Indirect ESD testing, which subjects the EUT only to the fields of the ESD, is also performed.

A method that provides better insight into the possible root cause of an immunity or susceptibility problem is susceptibility scanning. In this method, a probe is moved above the equipment (e.g., PCB, cables etc.) and a strong local field is caused by injecting pulses or RF signals into the probe. The probe is moved around and the reaction of the equipment is observed. This way, local areas of higher susceptibility can be identified.

The near field EMI scanning and the near field susceptibility scanning both identify local effects, which are difficult to connect to the system level performance of the EUT. Thus, strong local fields are not necessarily the cause of strong radiated emissions, and local areas of high susceptibility are not necessarily the reason for immunity or ESD problems as they show up if the complete system is tested in accordance to the standards, such as IEC 61000-4-3 (radiated immunity) or IEC 61000-4-2 (ESD).

Although the above analyses can provide EMC information about EUTs, there is a need for a system and method for EMC testing that helps to connect local effects with system effects.

SUMMARY OF THE INVENTION

A resonance scanning system and method for testing equipment for electromagnetic resonances uses a resonance detection subsystem with at least one probe to identify at least one of a resonating location, a resonating frequency and a quality factor of a resonance of the equipment and an automatic scanning subsystem to displace the probe to different testing locations of the equipment so that the resonance detection subsystem can determine if any of the different testing locations of the equipment exhibits electromagnetic resonances.

A resonance scanning system in accordance with an embodiment of the invention comprises a resonance detection subsystem and an automatic scanning subsystem. The resonance detection subsystem is configured to transmit input signals into the equipment and to receive the output signals due to resonances in response to the input signals to identify at least one of a resonating location, a resonating frequency and a quality factor of a resonance the equipment. The resonance detection subsystem includes a probe to at least receive the output signals. The automatic scanning subsystem is configured to displace the probe of the resonance detection subsystem to different testing locations of the equipment to scan the equipment with the probe so that the resonance detection subsystem can determine if any of the different testing locations of the equipment exhibits electromagnetic resonances.

A method for testing equipment for electromagnetic resonances in accordance with an embodiment of the invention comprises automatically positioning a probe at different locations of the equipment, transmitting input signals into the equipment at the different locations of the equipment, receiving output signals due to resonances in response to the input signals transmitted into the equipment using the probe, and processing the output signals to identify at least one of a resonating location, a resonating frequency and a quality factor of a resonance of the equipment.

A resonance scanning system for testing equipment for electromagnetic resonances in accordance with another embodiment of the invention comprises a resonance detection subsystem and an automatic scanning subsystem. The resonance detection subsystem includes a first probe configured to transmit input signals into the equipment and a second probe configured to receive output signals from the equipment due to resonances in response to the input signals to identify at least one of a resonating location, a resonating frequency and a quality factor of a resonance of the equipment. The automatic scanning subsystem is configured to displace the first and second probes of the resonance detection subsystem to different testing locations of the equipment to scan the equipment with the first and second probes so that the resonance detection subsystem can determine if any of the different testing locations of the equipment exhibits electromagnetic resonances.

Other aspects and advantages of the present invention will become apparent from the following detailed description,

DETAILED DESCRIPTION

Figure 1:
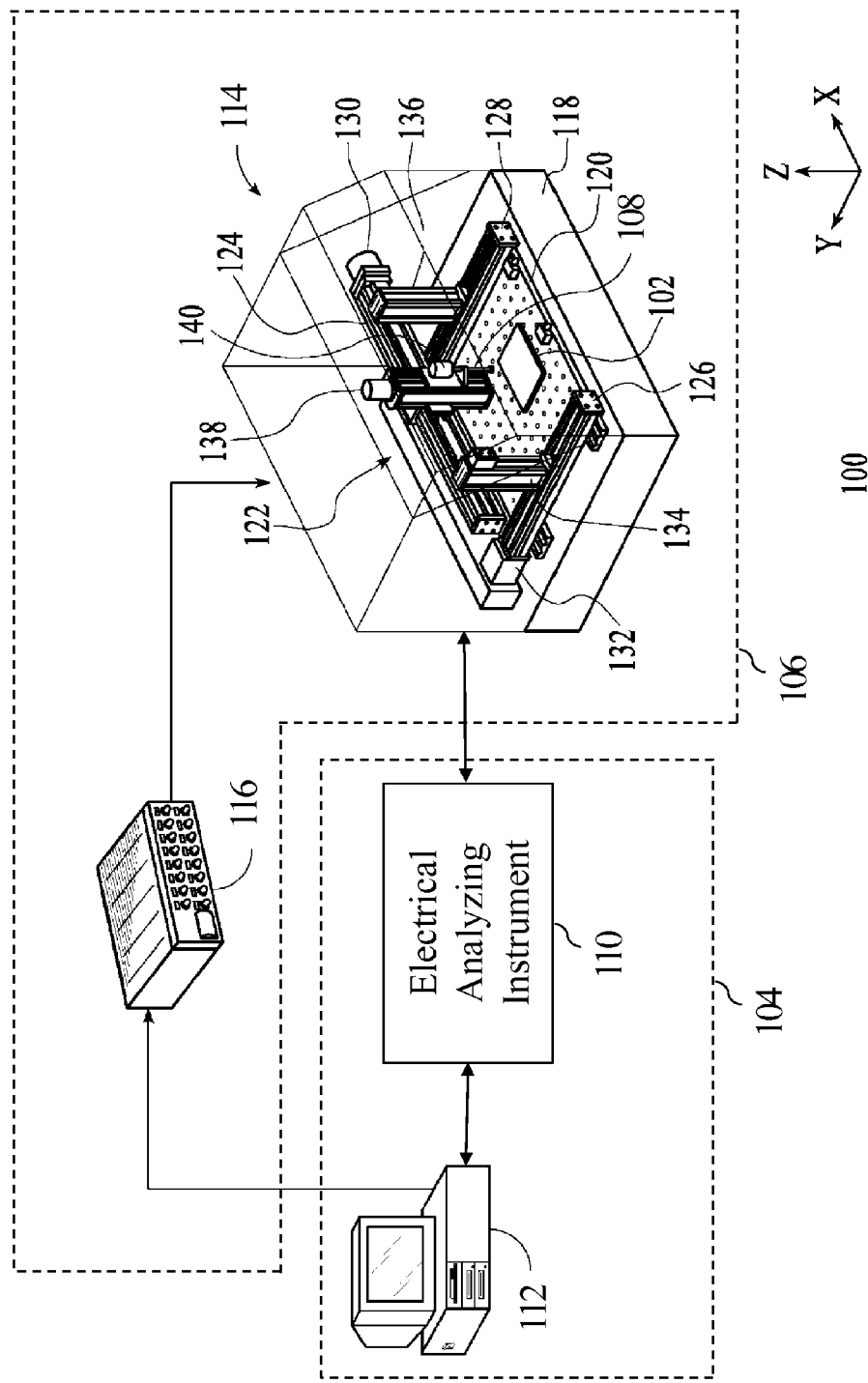
FIG. 1 is a diagram of a resonance scanning system in accordance with an embodiment of the invention.

With reference to FIG. 1, a resonance scanning system 100 for testing the resonances of an equipment under test 102 (EUT), which can be an integrated circuit (IC), a printed circuit board (PCB) or any electronic device, module or system, in accordance with an embodiment of the invention is described. As described in more detail below, the resonance scanning system 100 is designed to subject the EUT 102 to input signals at different testing locations of the EUT and to receive resonance-dependent output signals in response to the input signals. The output signals are then analyzed to determine resonating locations, the resonating frequencies and/or the quality factor of the resonances within the EUT 102 or its attached cables, which may be presented in a visual form so that a user can correlate the resonating locations, resonance frequencies and/or quality factors with corresponding structures of the EUT for electromagnetic compatibility (EMC) analysis.

The challenges in EMC analysis is often locating the coupling paths and, to a lesser degree, locating the antennas. The most basic coupling theory for EMI predicts a broadband, frequency independent, or linear increase of the coupling strength with increasing frequency. These models do not intend to take the complexity of real systems into account. Their use lies in the illustration of basic principles, and their direct application is limited to simple cases on PCBs or cases with well controlled field structures as they can be found in transverse-electromagnetic (TEM) cell tests.

With most basic coupling mechanisms, smooth (e.g., 20 dB/decade) coupling behavior is expected. In practice, however, this smooth frequency behavior is not observed, especially in testing complex electronic systems, such as a laptop. For example, experience in immunity testing of systems has shown that immunity failures are usually not of broadband nature, but rather occur in a relatively narrow portion of the spectrum. A similar effect is observed in radiated emissions testing. If emission testing is performed while the clock frequencies are varied over a wide range, strong peaking in the radiated signals is observed. All these examples are indicative of internal system resonances. At resonance frequencies, the EMI radiation or immunity sensitivity may increase by orders of magnitude.

Resonances strongly affect both the EMI and the immunity/ESD performance of a EUT. Resonances worsen susceptibility of equipment because at the frequency of the resonance, the external field will be strongly enhanced due to the resonating structure. This will allow strong coupling to locally susceptible locations, thus worsening the overall susceptibility of the equipment. In case of EMI, a locally strong field, current or voltage can couple to a resonating structure. Although the locally strong voltage, current or field is by itself not able to radiate a strong field, it will do so by coupling to the resonating structure. The resonance will enhance fields, voltages and currents further and many resonating structures form good antennas.

As explained above, resonating structures often form the most important coupling path between local effects and the overall performance of a EUT. For that reason, it is important to identify resonating structures in EUTs.

The resonance scanning system 100 operates to detect system resonance locations, resonance frequencies and/or their quality factors of EUTs, which can be combined with information obtained with either near field EMI scanning or with susceptibility scanning for EMC analysis.

As shown in FIG. 1, the resonance scanning system 100 includes a resonance detection subsystem 104 and an automatic scanning subsystem 106. The resonance detection subsystem 104 is configured to transmit input signals into the EUT 102 and to receive output signals that are indicative of resonances. In this embodiment, the resonance detection subsystem 104 uses a single probe 108, which is used to both transmit the input signals and to receive the output signals. However, in other embodiments, the resonance detection subsystem 104 may use more than one probe to transmit and receive signals for resonance detection. The resonance detection subsystem 104 is also configured to process the received output signals at different testing locations of the EUT 102 to detect resonances at one or more of these testing locations of the EUT. The resonance detection subsystem 104 is further configured to display the detected resonances over an image of the EUT 102 so that the detected resonances can be easily visualized by a user. The automatic scanning subsystem 106 is configured to automatically displace the probe 108 to the different testing locations of the EUT 102 so that the probe can transmit input signals into these testing locations of the EUT to subject one or more structures of the EUT near the testing locations to the input signal and to receive output signals at these testing locations of the EUT that are indicative of resonances from the subjected structures of the EUT.

The resonance detection subsystem 104 of the resonance scanning system 100 includes the probe 108, an electrical analyzing instrument 110 and a processing device 112. The probe 108 is electrically connected to the electrical analyzing instrument 110, which provides driving signals to the probe. In this embodiment, the probe 108 is designed to emit input signals, such as magnetic or electric field signals, at various frequencies when supplied with drive signals from the electrical analyzing instrument 110. The input signals are transmitted into the EUT 102 at selected testing locations of the EUT. The probe 108 is also designed to receive output signals at the selected testing locations of the EUT 102, which are indicative of resonances.

In this embodiment, the output signal is the signal reflected by the probe 108. If no resonating structure is nearby with respect to the probe 108, then more energy will be reflected. If the probe 108 couples to a resonating structure, then less energy will be reflected back into the transmitter, i.e., the electrical analyzing instrument 110, as part of the energy is dissipated by the resonating structure. The received output signals are transmitted into the electrical analyzing instrument 110, which can measure the reflection and/or transmission coefficients of the EUT 102 at various frequencies using at least the received output signals.

In some embodiments, the electrical analyzing instrument 110 is a network analyzer 110, in particular, a vector network analyzer. Thus, the electrical analyzing instrument 100 is referred to herein as a network analyzer. In these embodiments, the electrical analyzing instrument 110 can be one of many commercially available vector network analyzers. As an example, the electrical analyzing instrument 110 may be an Agilent 8753ES vector network analyzer. However, in related embodiments, the electrical analyzing instrument 110 may be a spectrum analyzer with a tracking generator or a spectrum analyzer with an RF generator, or an RF source and an oscilloscope.

The processing device 112 of the resonance detection subsystem 104 is configured to control the automatic scanning subsystem 106 and to process the data acquired by the network analyzer 110 with respect to the reflection coefficients to determine any resonating locations of the EUT 102. The processing device 112 may use various data processing techniques to make the determination. In some embodiments, the processing device 112 calibrates the raw data from the network analyzer 110 using reference data, which may be data from the immediate testing environment. The raw data is then calibrated by subtracting the reference data values from the raw data values. The resulting data is then further processed by smoothing the data and using an envelope to disregard noise on the data, thus to avoid confusing noise with resonating frequencies. After the processing, peaks or valleys of the data may be selected using thresholds to identify corresponding resonating locations of the EUT 102. The resulting data can also be used to determine fundamental and harmonic frequencies of the resonances, the locations and the quality factor of the resonances.

The processing device 112 may also be configured to visually present the identified resonating locations of the EUT 102, e.g., on a display, using an image of the EUT for EMC analysis. As an example, graphical representation of the identified resonating locations of the EUT 102 may be superimposed over an image of the EUT so that a user can readily determine structures corresponding to the resonating locations. Alternatively, the graphical representation of the identified resonating locations of the EUT 102 may be displayed next to the image of the EUT for reference.

In some embodiments, the processing device 112 is a computer system, such as a personal computer (PC), with one or more computer programs that execute a routine to automatically perform a resonance scan testing on the EUT 102. The resonance scan testing routine is described below as part of the overall operation of the resonance scanning system 100.

The automatic scanning subsystem 106 of the resonance scanning system 100 includes a probe positioning mechanism 114 and a motor driver 116. The probe positioning mechanism 114 is designed to position the probe 108 to different testing locations of the EUT 102 so that the probe can transmit input signals to and receive output signals at these testing locations of the EUT. In an embodiment, as shown in FIG. 1, the probe positioning mechanism 106 includes a base 118, a scanning plate 120, a scan head 122, linear tracks 124, 126 and 128, motors 130 and 132 and connecting structures 134 and 136. The base 118 provides structural support for other components of the probe positioning mechanism 114. The scanning plate 120 is attached to the base 118. The scanning plate 120 provides a surface on which the EUT 102 is placed for testing. The scan head 122 is configured to hold the probe 108 and to raise and lower the probe along the Z-axis, as indicated in FIG. 1, so that the probe can be positioned above a desired testing location of the EUT 102. The scan head 122 is also configured to rotate the probe 108 about the Z-axis. The scan head 122 includes a motor 138 to vertically displace the probe 108 along the Z-axis and a motor 140 to rotate the probe about the Z-axis. The scan head 122 is operably connected to the linear track 124, which is aligned with the X-axis, as indicated in FIG. 1. The motor 130 is attached to the track 124 to linearly displace the scan head 122 along the X-axis. Thus, the motor 130 controls the linear displacement of the probe 108, which is attached to the scan head 122, along the X-axis. The track 124 is attached to the connecting structures 134 and 136, which are operably connected to the linear tracks 126 and 128. The linear tracks 126 and 128 are attached to the base 118 and are aligned with the Y-axis, as indicated in FIG. 1. The motor 132 is attached to the track 126 to linearly displace the connecting structures 134 and 136, the track 124 and the scan head 122 along the Y-axis. Thus, the motor 132 controls the linear displacement of the probe 108, which is attached to the scan head 122, along the Y-axis. Consequently, the probe positioning mechanism 114 is enabled to move the probe 108 along the X-axis, the Y-axis and the Z-axis, and to rotate the probe about the Z-axis.

The motor driver 116 of the automatic scanning subsystem 106 is designed to provide driving signals to the probe positioning mechanism 114 so that the probe 108 can be displaced to desired testing locations of the EUT 102 and/or be rotated to desired rotational positions. The motor driver 116 is electrically connected to the motors 130 and 132 of the probe positioning mechanism 114 to provide driving signals to these motors so that the probe 108 can be linearly displaced along the X-axis and the Y-axis. The motor driver 116 is also electrically connected to the motors 138 and 140 of the scan head 122 to provide driving signals to these motors so that the probe 108 can be vertically moved along the Z-axis and be rotated about the Z-axis. In an embodiment, the motor driver 116 is controlled by the processing device 112. Thus, the processing device 112 is able to track the movements of the probe 108 that is being displaced by the automatic scanning subsystem 106.

Figure 2:
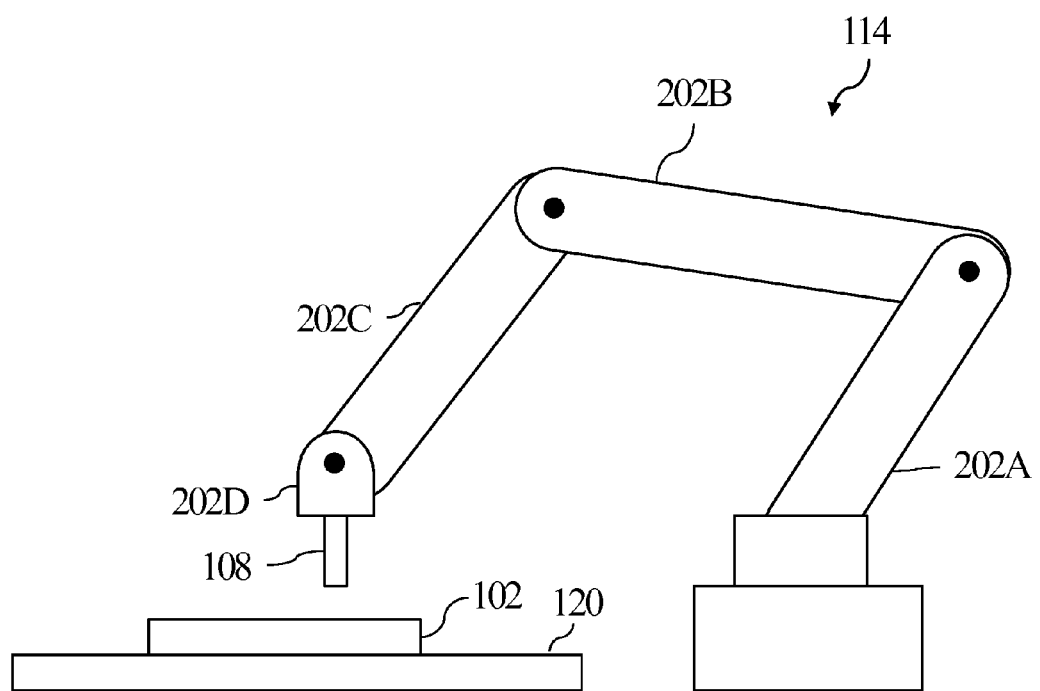
FIG. 2 is a diagram of a probe positioning mechanism of the resonance scanning system of FIG. 1 in accordance with an embodiment of the invention.

In an alternative embodiment, as illustrated in FIG. 2, the probe positioning mechanism 114 may be configured as a robotic arm to displace and rotate the probe 108 as needed. As an example, the robotic arm may have six degrees of freedom. In the illustrated embodiment, the robotic arm 114 includes sections 202A, 202B, 202C and 202D, which are connected by joints that allow rotational motion and/or translational displacement. Thus, the robotic arm 114 can move the probe 108 to the different testing locations of the EUT 102 for resonance scanning. The robotic arm 114 can be useful when the EUT 102 is a more complex shaped object, e.g., a PC with a monitor or other non-flat object. For a complex shaped EUT, the robotic arm 114 can move the probe 108 around inside and outside of the EUT, which is not possible using the probe positioning mechanism of FIG. 1.

The probe positioning mechanism 114 of the resonance scanning system 100 is not limited to the embodiments shown in FIGS. 1 and 2. The probe positioning mechanism 114 can be any type of a mechanical device that is able to move the probe 108 to different testing locations of the EUT. Furthermore, the probe positioning mechanism 114 may use other means than motors to move the probe 108, e.g., an air pressure driven system.

Figure 3:
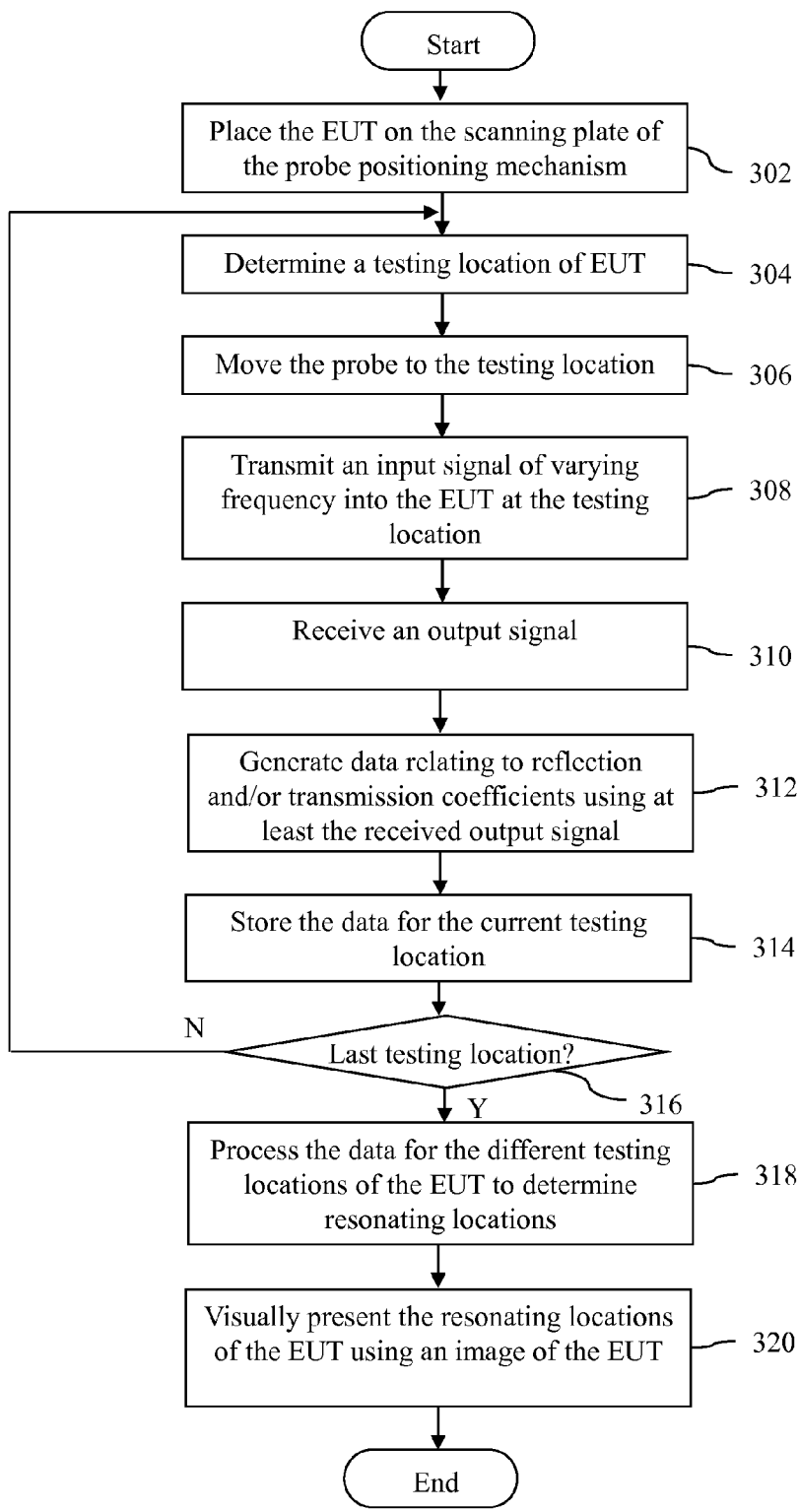
FIG. 3 is a flow diagram of the overall operation of the resonance scanning system of FIG. 1 in accordance with an embodiment of the invention.

The overall testing operation of the automatic resonance scanning system 100 in accordance with an embodiment of the invention is described with reference to the flow diagram of FIG. 3. The testing operation begins at block 302, where the EUT 102, which may be powered down or disconnected from any power supply, is placed on the scanning plate 120 of the probe positioning mechanism 114. Next, at block 304, the processing device 112 determines a new testing location of the EUT 102. Next, at block 306, the processing device 112 transmits control signals to the motor driver 116 to drive the probe positioning mechanism 114 to move the probe 108 to the testing location of the EUT 102. The processing device 116 may also transmit control signals to rotate the probe 108 about the Z-axis.

Next, at block 308, the network analyzer 110 applies a drive signal to the probe 108 to transmit an input signal of varying frequency into the EUT 102 at the testing location. In some embodiments, the network analyzer 110 is under the control of the processing device 112. Next, at block 310, the network analyzer 110 receives an output signal via the probe 108. The output signal is indicative of resonances at the current testing location of the EUT. The process of transmitting the input signal and receiving the output signal may be performed in parallel. Next, at block 312, data relating to reflection and/or transmission coefficients for the current testing location of the EUT at different frequencies is generated using at least the received output signal. Next, at block 314, the data for the current testing location is stored, e.g., in the network analyzer 110 or the processing device 112.

Next, at block 316, the processing device 112 determines whether the current testing location of the EUT 102 is the last testing location. If no, then the operation proceeds back to block 304 to acquire data for the next testing location of the EUT 102. If yes, then the operation proceeds to block 318, where the data for the different testing locations of the EUT 102 are processed to determine resonating locations of the EUT. Next, at optional block 320, the resonating locations of the EUT 102 are visually presented using an image of the EUT for EMC analysis. In other embodiments where more than one probe is used to identify resonances, the acquired data can be displayed and updates as the EUT 102 is being scanned. If an array of probes is used, then the identification of resonances at different locations of the EUT 102 can be done at the same time.

Figure 4:
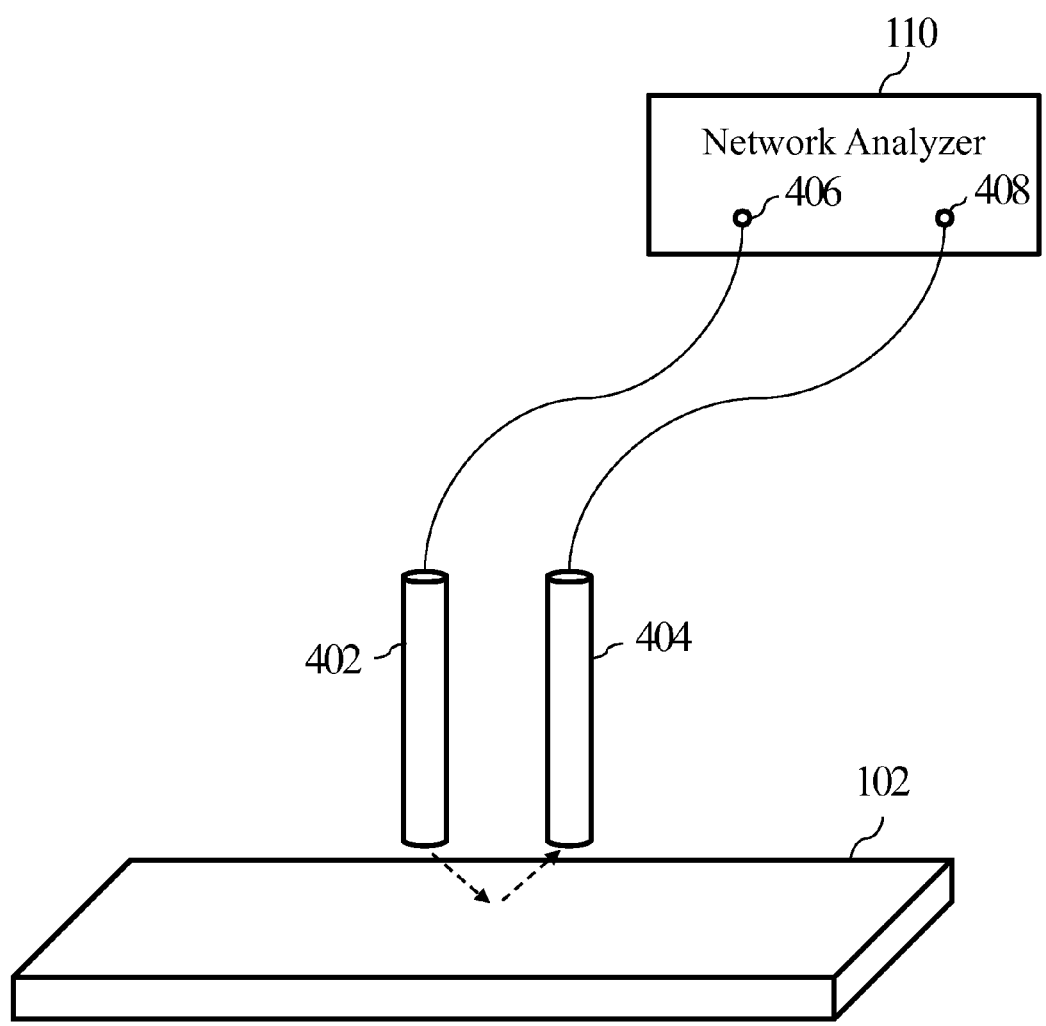
FIG. 4 is a diagram of two probes that can be used in the resonance scanning system of FIG. 1 in accordance with some embodiments of the invention.

As mentioned above, in other embodiments, the resonance detection subsystem 104 may use more than one probe to transmit and receive signals. In some embodiments, as illustrated in FIG. 4, the resonance detection subsystem 104 uses two probes 402 and 404, which are decoupled from each other, e.g., by their field structure, distance or field component. One of the probes, i.e., the probe 402, is used to exclusively transmit input signals into the EUT 102 and the other probe, i.e., the probe 404, is used to exclusively receive output signals from the EUT. The probe 402 is electrically connected to a port 406 of the network analyzer 110, while the probe 404 is electrically connected to another port 408 of the network analyzer. If resonating structures can couple to both probes 402 and 404, an increased S21 value will be observed at the resonance frequency. Thus, resonating locations of the EUT 102 can be found using these probes 402 and 404. In an embodiment, the probe 402 is configured to emit electric and/or magnetic field signals and the probe 404 is configured to receive electric and/or magnetic field signals. Although the probe 402 is described as being the transmitting probe and the probe 404 is described as being the receiving probe, it does not matter which probe is the transmitting probe and which is the receiving probe. Thus, the probes 402 and 404 are interchangeable with respect to transmitting and receiving of signals.

If the resonances are determined by a single probe system which uses the signal reflected by the probe as output signal and observes a reduction of the output signal as indicator of resonating structures in proximity of the probe, then the strength of the detection is strongly dependent on the coupling between the probe and the resonating structure. If a two probe system is used which uses the signal received by the probe as output signal, and the probes are designed such that the direct coupling between them is less than the coupling via the resonating structure, then resonances can be detected with less sensitivity to the coupling of the transmitting probe to the resonating structure and the coupling of the resonating structure to the receiving antenna. Thus, a two probe system offers a large advantage over a single probe system to more effectively detect resonances.

Figure 5:
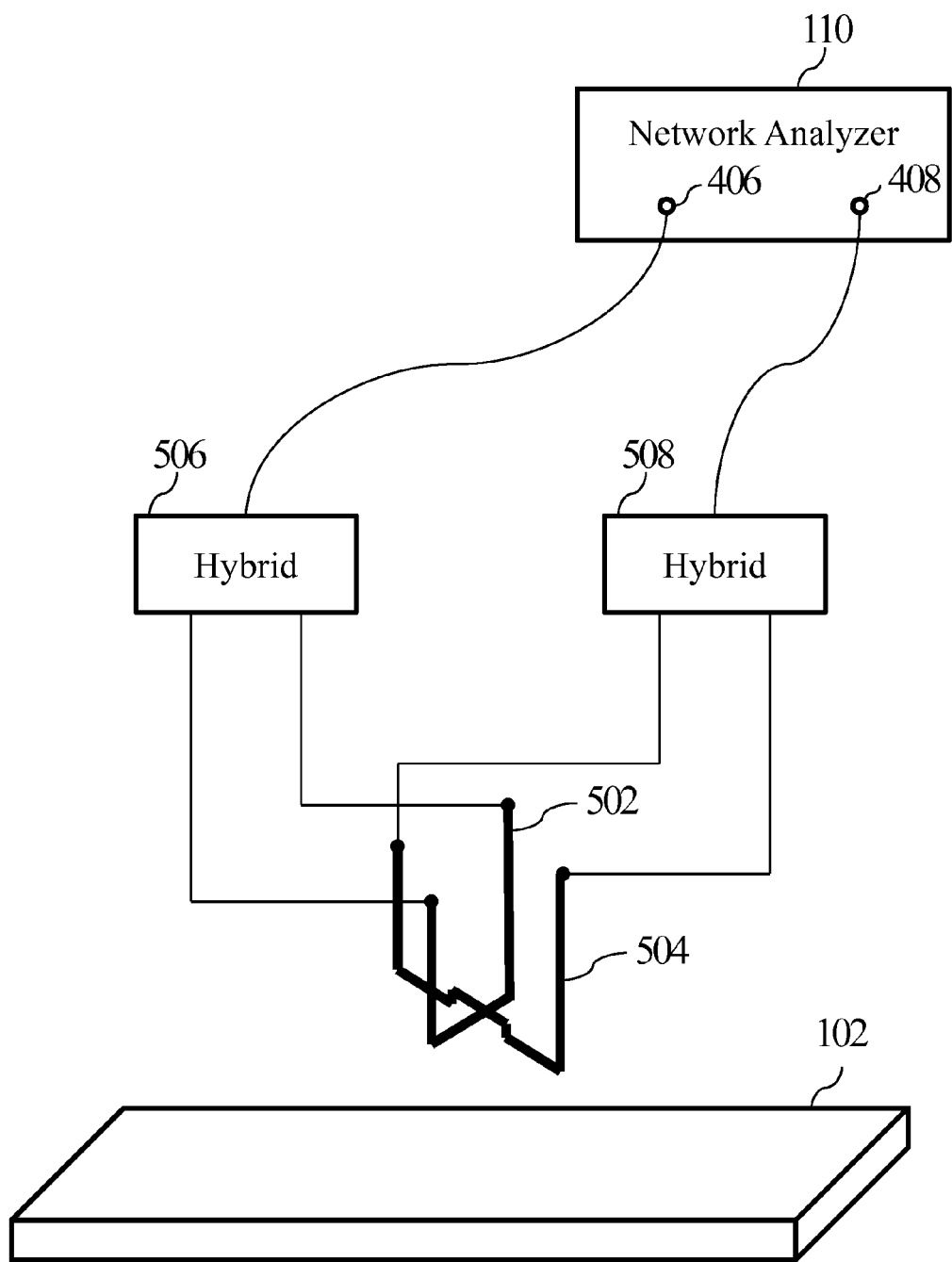
FIG. 5 is a diagram of two orthogonal loop probes that can be used in the resonance scanning system of FIG. 1 in accordance with an embodiment of the invention.

In an embodiment, as illustrated in FIG. 5, the resonance detection subsystem 104 uses two orthogonal loop probes 502 and 504 to transmit mainly magnetic field signals and receive mainly magnetic field signals. The loop probes 502 and 504 are connected to 180-degree hybrids 506 and 508, respectively. The hybrid 506 is electrically connected to the port 406 of the network analyzer 110, while the hybrid 508 is electrically connected to the port 408 port of the network analyzer. The loop probe 502 is used to transmit the magnetic input signals into the EUT 102, while the loop probe 504 is used to receive the magnetic output signals, which can then be used to detect resonances. The use of orthogonal loop probes is described in more detail in a paper by Tun Li, Yong Cheh Ho and David Pommerenke, titled "Orthogonal Loops Probe Design and Characterization for Near-Field Measurement" for IEEE EMC Symp. Detroit 2008, which is specifically incorporated herein by reference. The two orthogonal loop probes 502 and 504 are both attached to the probe positioning mechanism 114 so that both probes are displaced together to scan the EUT during operation. The use of hybrids is not necessary; they help to suppress the electric field coupling. Instead, shielded magnetic loops can be used that suppress the electric field coupling.

Figure 6:
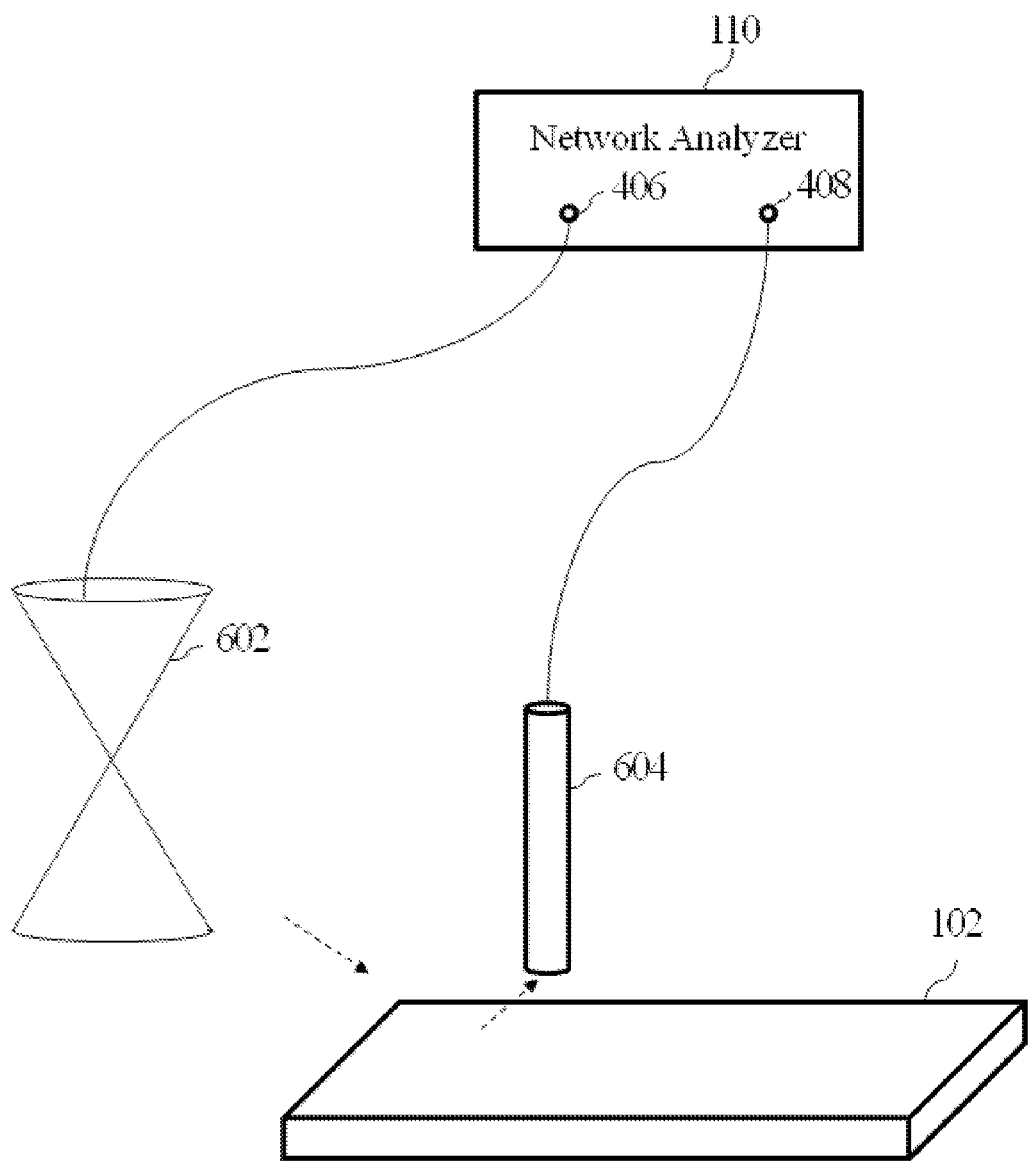
FIG. 6 is a diagram of an antenna and a probe that can be used in the resonance scanning system of FIG. 1 in accordance with an embodiment of the invention.

In another embodiment, as illustrated in FIG. 6, the resonance detection subsystem 104 uses a probe 602 in the form of an antenna to transmit input signals into the EUT 102 and a probe 604 to receive output signals from the EUT. In a particular implementation, the antenna 602 is used to emit a TEM wave at the location of the EUT. The EUT is usually placed in the far field region of the antenna. The antenna 602 could be e.g., a log-periodic antenna or a TEM horn. The antenna 602 may be configured in any appropriate shape. In some embodiments, the antenna 602 may be conical in shape, as shown in FIG. 6. The probe 604 may be configured to receive electric and/or magnetic field signals. The antenna 602 is electrically connected to the port 406 of the network analyzer 110, while the probe 604 is electrically connected to the port 408 of the network analyzer. During operation, the antenna 602 is not displaced, while the probe 604 is displaced by the probe positioning mechanism 114 to scan the EUT 102.

In this embodiment, the fixed transmitting antenna 602 will illuminate a large area of the EUT 102, and the displaced probe 604 will identify which resonances are excited by the user selected polarization, distance and location of the transmitting antenna. The output signal is the signal received by the displaced probe 604. If an excited resonating structure is in close proximity of the receiving probe 604, the output signal will increase. The receiving probe 604 receives the scattered signal from the resonating structure.

A concern with the use of the stationary antenna 602 and the scanning probe 604 is that the resulting data is sensitive to other reflections, e.g., a metallic wall, which makes it hard to analyze the resulting data. Another concern is that at each transmit antenna location, distance and polarization, the same resonances will not necessarily will be excited. Thus, one may have to scan for resonances using different transmit antenna locations, distances and polarizations.

Figure 7A:
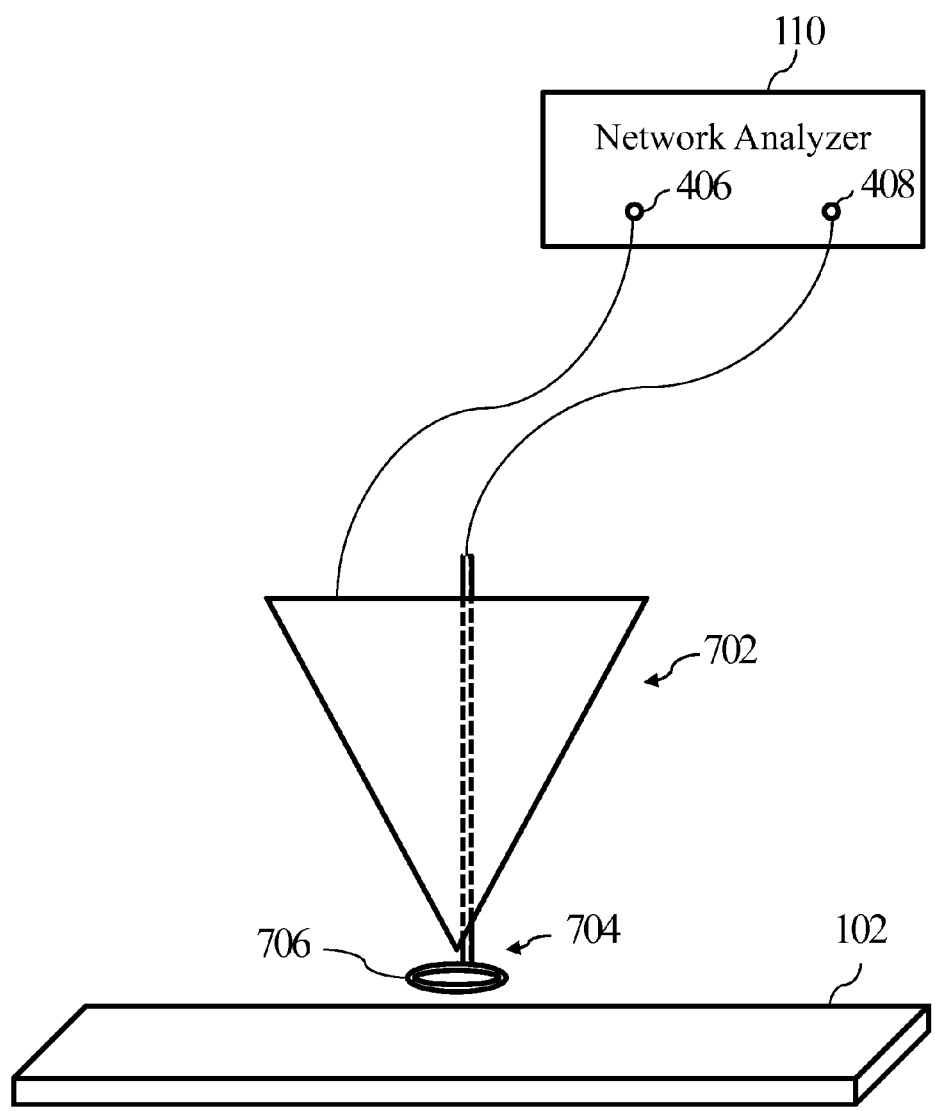
FIGS. 7A and 7B are diagrams of a probe assembly with an antenna and a probe that can be used in the resonance scanning system of FIG. 1 in accordance with an embodiment of the invention.

In another embodiment, as illustrated in FIG. 7A, the resonance detection subsystem 104 again uses one probe 702 in the form an antenna to transmit input signals into the EUT 102 and another probe 704 to receive output signals from the EUT. The antenna 702 is electrically connected to the port 406 of the network analyzer 110, while the probe 704 is electrically connected to the port 408 of the network analyzer. However, in this embodiment, the antenna 702 and the probe 704 are positioned closer together and are both attached to the probe positioning mechanism 114 so that the antenna 702 and the probe 704 can be displaced together to scan the EUT 102 during operation.

Figure 7B:
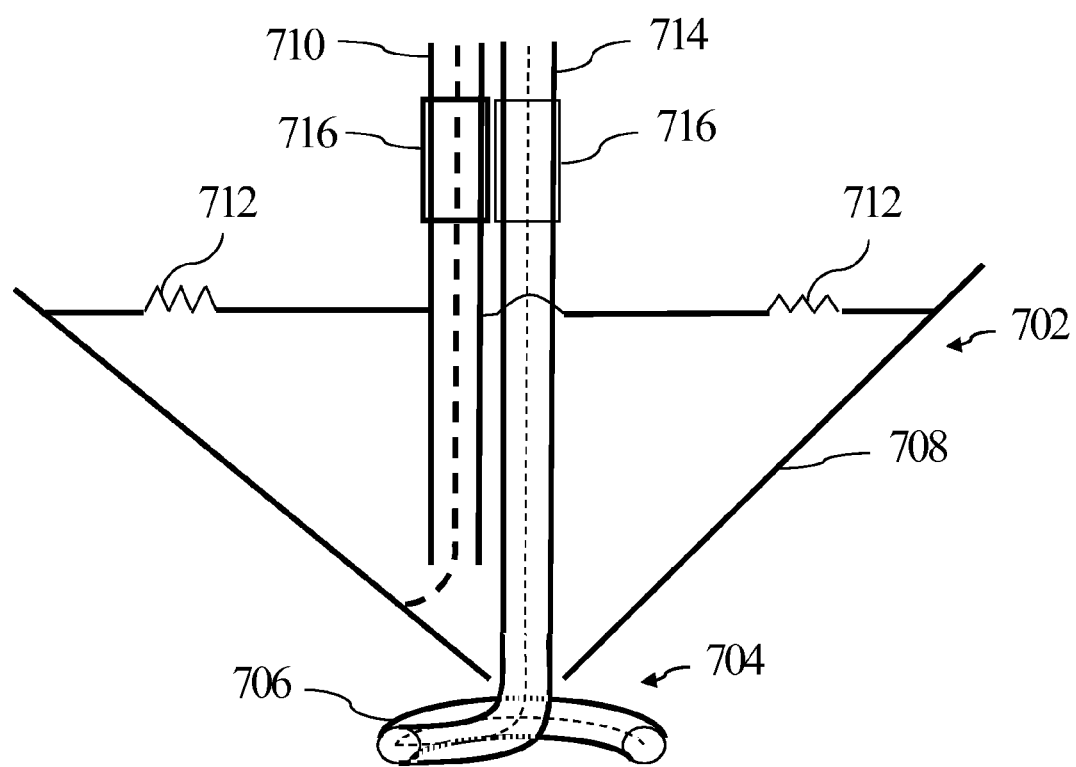
Figure 8:
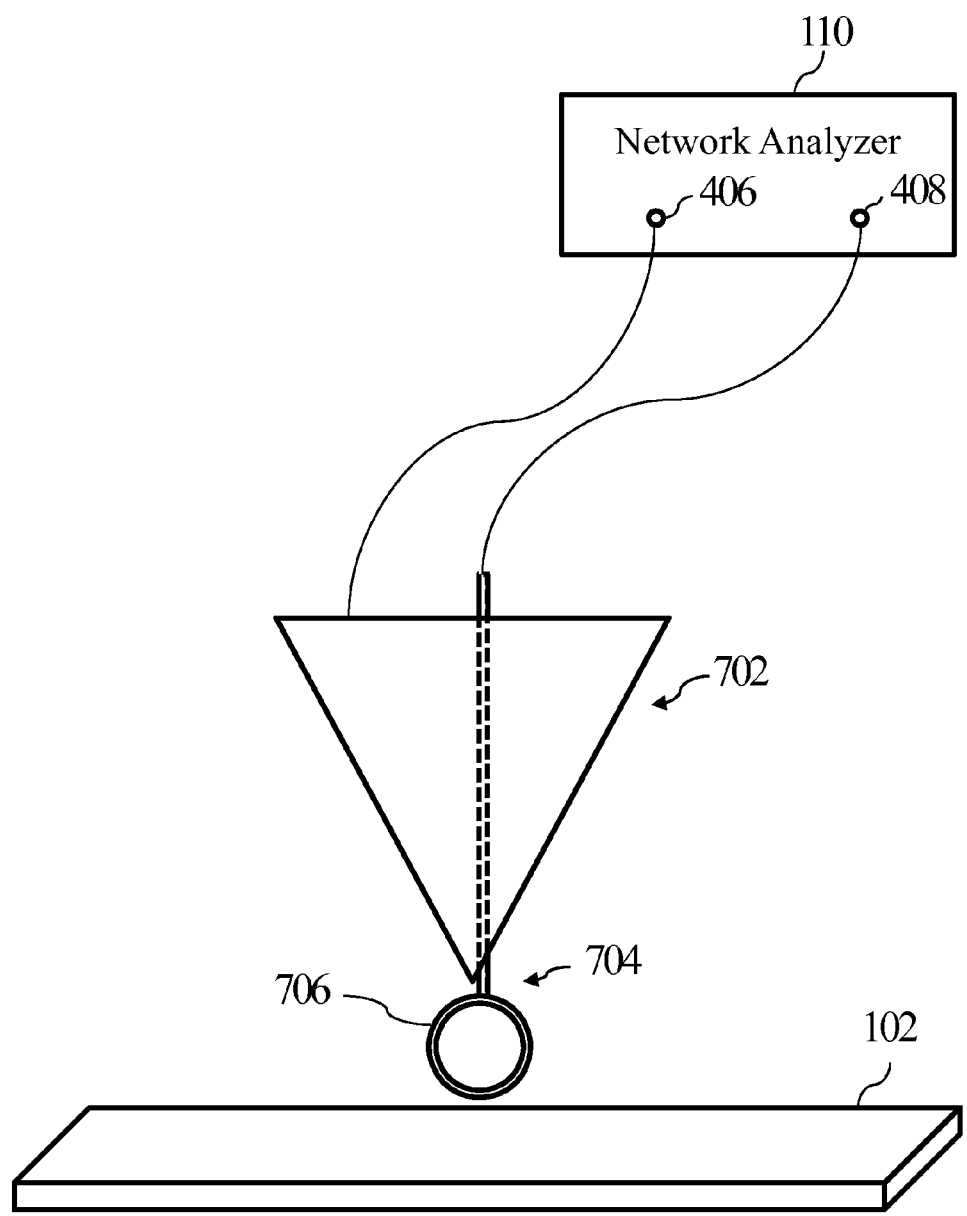
FIG. 8 is a diagram of a probe assembly with an antenna and a probe that can be used in the resonance scanning system of FIG. 1 in accordance with another embodiment of the invention.

In a particular implementation, the two probes 702 and 704 are combined in a probe assembly. The transmitting probe 702 is made from a cone 708 that is fed by a coax cable 710 from the network analyzer 110, as illustrated in FIG. 7B. The cone structure 708 is fed on its inside and one or more termination resistors 712 prevent strong reflections and internal resonances of the cone structure. The wave will exit the cone 708 at its top and couple back to the EUT 102 after it travels on the outside of the cone in the direction of its tip. The receive side of the antenna, i.e., the probe 704, is built as a small shielded loop 706 positions at the tip of the cone and connected to a coax cable 714. In this embodiment, the probe assembly includes ferrite structures 716 on the coax cables 710 and 714, which prevent common mode waves. In other embodiments, the ferrite structures 716 may be replaced with structures made of other lossy dielectric or lossy magnetic material. The shielded loop 706 will receive the magnetic field scattered from the resonating structure. The shield loop 706 may be orientated horizontal to the EUT 102, i.e., the shielded loop 706 is situated on a plane that is substantially parallel to the upper surface of the EUT 102. The term "substantially" as used herein means plus or minus ten percent with respect to any value or angle. In an alternative embodiment, as illustrated in FIG. 8, the shielded loop 706 may be orientated vertical to the EUT 102, i.e., the shielded loop 706 is situated on a plane that is substantially perpendicular to the upper surface of the EUT. In other embodiments, the shielded loop 706 may be orientated at any angle, e.g., 45 degrees, with respect to the upper surface of the EUT 102, which would change the receiving properties of the shielded loop.

In this embodiment, the transmitting probe and the receiving probe are combined into one probe assembly, which is displaced by the automatic scanning subsystem 106. The transmitted signal couples to a possible resonating structure and is scattered by the resonating structure and received by the receiving probe. If a resonance occurs, a stronger coupling will take place from the transmitting probe to the receiving probe.

In this embodiment, the output signal is the received signal. If an exited resonating structure is in close proximity of the receiving probe, having a field orientation and type that can be received by the receiving probe, then the output signal will increase. The receiving probe receives the scattered signal from the resonating structure.

By symmetry and by the difference in the field components, there will be little coupling between the two probes 702 and 704 combined in the probe assembly. An S21 value of −60 dB or better can be typically achieved up to 1 GHz. This way resonances can be detected even if the coupling from the transmitting probe 702, to the resonating structure and back to the receiving antenna 704 is as week as −60 dB.

For the optimization of such a probe assembly, it is important that the direct coupling between the two closely spaced probes is weak, such that it does not overwrite the coupling via the resonating structure. For achieving a weak coupling between the two closely related probes, one can use a variety of methods. Both probes can excite the same, e.g., magnetic field, but they can be orthogonal to each other. Thus, the magnetic flux caused by the transmitting signal does not penetrate the coupling area of the receiving magnetic probe. Alternatively, one can have different fields being probed, e.g., the transmitting antenna causes a magnetic field, while the receiving antenna receives an electric field. Further enhancement of the reduction of the direct coupling path between the probes can be achieved by data processing, e.g., numerical compensation of the remaining coupling.

Another factor to consider in the probe selection is the sizes of the probes. On one side, one wants to identify local resonating structures of smallest size. On the other side, one wants to use the resonance scanning as a method to establish a link between local behavior and system level behavior. If both the receiving and the transmitting probes are very small, a very good local resolution will be achieved. However, the local excitation by the transmitting probe will not resemble the excitation to the EUT which the EUT would experience if it is subjected to a field such as in a system level radiated immunity test, for example, IEC 61000-4-3.

Another method is to implement a small receiving antenna but a larger transmitting antenna. In this case, an excitation is achieved that more resembles the fields as seen during, e.g., radiated immunity testing, but the local resolution is still determined by the size of the receiving antenna.

As most resonating structures are passive, one can transmit with the probe or antenna designated in the text above as receive antenna and receive with the probe or antenna designated in the text above as transmit antenna or probe without affecting the performance of the system.

Figure 9B:
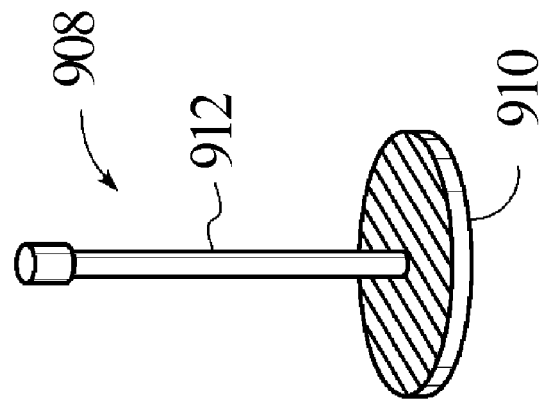
FIGS. 9A and 9B are diagrams of examples of probes that can be used in the resonance scanning system of FIG. 1 in accordance with embodiments of the invention.
Figure 9A:
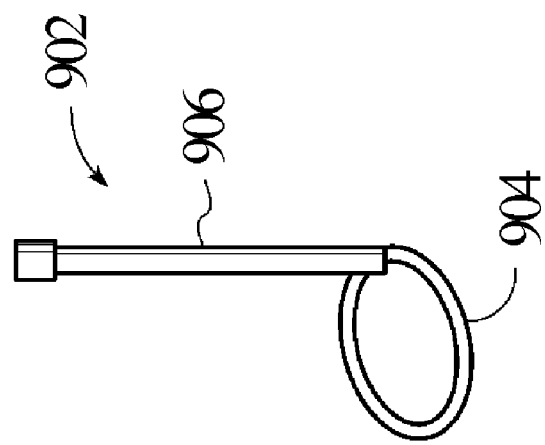

Turning now to FIGS. 9A and 9B, examples of probes that can be used in the resonance scanning system 100 are shown. FIG. 9A shows a magnetic (H) field probe 902, which is composed of a small loop 904 (a loop antenna) attached to a cable 906, e.g., a coax cable. The loop antenna 904 of the 902 may be perpendicular or parallel to the cable 906. FIG. 9B shows an electric (E) field probe 908, which is composed of electrode 910 of a high voltage capacitor attached to a cable 912, e.g., a coax cable. The probes 902 and 908 are only examples of probes that can be used in the resonance scanning system 100. Thus, other types of probes to transmit and/or receive signals can be used in the resonance scanning system 100.

Figure 10:
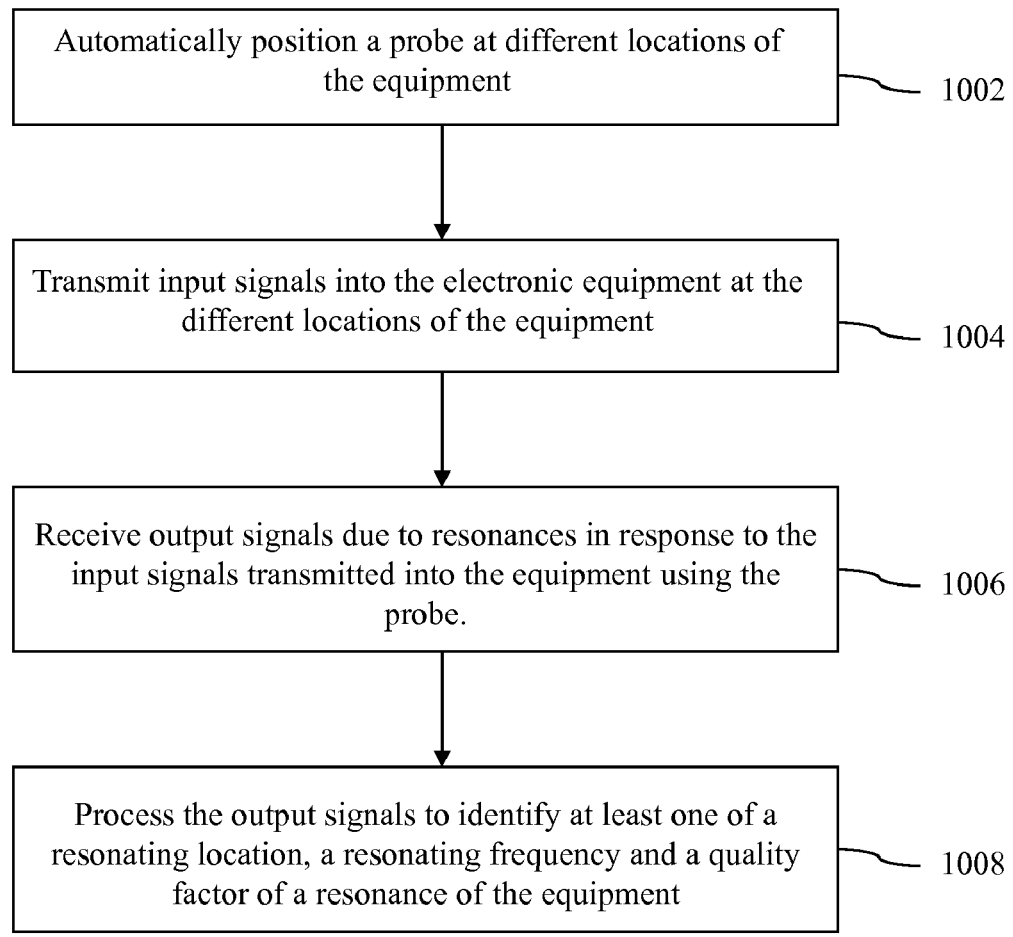
FIG. 10 is a flow diagram of a method for testing equipment for electromagnetic resonances in accordance with an embodiment of the invention.

A method for testing equipment for electromagnetic resonances in accordance with an embodiment of the invention is described with reference to a flow diagram of FIG. 10. At block 1002, a probe is automatically positioned at different locations of the equipment. At block 1004, input signals are transmitted into the equipment at the different locations of the equipment. At block 1006, output signals due to resonances in response to the input signals transmitted into the equipment are received using the probe. At block 1008, the output signals are processed to identify at least one of a resonating location, a resonating frequency and a quality factor of a resonance of the equipment.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A resonance scanning system for testing equipment for electromagnetic resonances, the system comprising:
    a resonance detection subsystem configured to transmit input signals into the equipment and to receive output signals due to resonances in response to the input signals to identify at least one of a resonating location, a resonating frequency and a quality factor of a resonance of the equipment, the resonance detection subsystem including a probe to at least receive the output signals; and
    an automatic scanning subsystem configured to displace the probe of the resonance detection subsystem to different testing locations of the equipment to scan the equipment with the probe so that the resonance detection subsystem determines if any of the different testing locations of the equipment exhibits electromagnetic resonances.

2. The system of claim 1 wherein the resonance detection subsystem further includes an electrical analyzing instrument connected to the probe, the electrical analyzing instrument being configured to determine transmission and/or reflection characteristics of electrical signals.

3. The system of claim 1 wherein the probe is further configured to transmit the input signals.

4. The system of claim 1 wherein the resonance detection subsystem further includes another probe configured to transmit the input signals.

5. The system of claim 4 wherein the another probe is an antenna configured to transmit the input signals in the form of a transverse electromagnetic wave at the different testing locations of the equipment.

6. The system of claim 4 wherein the another probe is attached to the automatic scanning subsystem to be displaced by the automatic scanning subsystem together with the probe.

7. The system of claim 6 wherein the probe is positioned below the another probe such that the probe is positioned between the another probe and the equipment during operation.

8. The system of claim 7 wherein the probe includes a loop to receive the output signals.

9. The system of claim 8 wherein the loop of the probe is orientated horizontally or vertically with respect to the upper surface of the EUT.

10. The system of claim 1 wherein the resonance detection subsystem is configured to visually present one or more resonating locations that have been determined superimposed over an image of the equipment.

11. The system of claim 1 wherein the automatic scanning subsystem includes a robotic arm mechanism to displace the probe.

12. The system of claim 1 wherein the automatic scanning subsystem includes a probe positioning mechanism that is configured to displace the probe using one or more linear tracks.

13. A method for testing equipment for electromagnetic resonances using a resonance scanning system, the resonance scanning system comprising a resonance detection subsystem including a probe and an automatic scanning subsystem configured to displace the probe of the resonance detection subsystem to different testing locations of the equipment to scan the equipment with the probe so that the resonance detection subsystem determines if any of the different testing locations of the equipment exhibits electromagnetic resonances, the method comprising:
    automatically positioning the probe at different locations of the equipment using the automatic scanning subsystem;
    transmitting input signals from the resonance detection system into the equipment at the different locations of the equipment;
    receiving, at the resonance detection system, output signals from the equipment due to resonances in response to the input signals transmitted into the equipment using the probe; and
    processing, at the resonance detection system, the output signals to identify at least one of a resonating location, a resonating frequency and a quality factor of a resonance of the equipment.

14. The method of claim 13 wherein the processing includes measuring at least one of reflection coefficient and transmission coefficient of the equipment.

15. The method of claim 13 wherein the transmitting includes transmitting the input signals using the probe.

16. The method of claim 13 wherein the transmitting includes transmitting the input signals using another probe.

17. The method of claim 16 wherein the automatically positioning includes displacing both the probe and the another probe together to scan the equipment.

18. The method of claim 13 further comprising visually presenting one or more resonating locations that have been determined superimposed over an image of the equipment.

19. A resonance scanning system for testing equipment for electromagnetic resonances, the system comprising:
    a resonance detection subsystem including a first probe configured to transmit input signals into the equipment and a second probe configured to receive output signals from the equipment due to resonances in response to the input signals to identify at least one of a resonating location, a resonating frequency and a quality factor of a resonance of the equipment; and
    an automatic scanning subsystem configured to displace the first and second probes of the resonance detection subsystem to different testing locations of the equipment to scan the equipment with the first and second probes so that the resonance detection subsystem determines if any of the different testing locations of the equipment exhibits electromagnetic resonances.

20. The system of claim 19 wherein the first probe is an antenna configured to transmit the input signals in the form of a transverse electromagnetic wave at the different testing locations of the equipment and the second probe includes a loop to receive the output signals.

* * * * *